United States Patent [19]
Redlich et al.

[11] 4,223,242
[45] Sep. 16, 1980

[54] METHOD AND CIRCUIT FOR DRIVING A PIEZOELECTRIC TRANSDUCER

[75] Inventors: Horst Redlich; Werther Hartmann, both of Berlin; Gerhard Dickopp, Hanover, all of Fed. Rep. of Germany

[73] Assignee: Ted Bildplatten AEG Telefunken, Switzerland

[21] Appl. No.: 954,605

[22] Filed: Oct. 25, 1978

[30] Foreign Application Priority Data

Oct. 26, 1977 [DE] Fed. Rep. of Germany ....... 2747851

[51] Int. Cl.[2] .............................................. H01L 41/10
[52] U.S. Cl. ...................................... 310/316; 310/326
[58] Field of Search ............... 310/314, 316, 317, 319, 310/326; 358/128

[56] References Cited

U.S. PATENT DOCUMENTS

| | | | |
|---|---|---|---|
| 2,415,832 | 2/1947 | Mason | 310/326 X |
| 3,029,356 | 4/1962 | Renaut | 310/314 |
| 3,409,787 | 11/1968 | Agalides et al. | 310/316 |
| 3,453,457 | 7/1969 | Hayer et al. | 310/326 |
| 3,805,100 | 4/1974 | Klemp et al. | 310/326 |
| 4,093,885 | 6/1978 | Brown | 310/316 X |

*Primary Examiner*—Mark O. Budd
*Attorney, Agent, or Firm*—McGlew and Tuttle

[57] ABSTRACT

A method and apparatus for reducing a resonance peak in a piezoelectric transducer for mechanically recording a signal having a band width of several MHz, in particular on a video disk comprising, applying a countercoupling current across terminals of the transducer for counteracting a current flow in the parallel capacitance of the transducer. A circuit of the invention comprises a piezoelectric transducer having two terminals and including in series a characteristic inductance, capacitance, and resistance, and a parallel capacitance characteristic in parallel to the series characteristic, a signal generator for generating the signal to be recorded, a transformer having a primary winding connected to the signal generator and a secondary winding connected to one terminal of the transducer with a symmetrically disposed central ground connected to the secondary winding. An opposite end of the secondary winding and the other terminal of the transducer are connected to a loading resistor and in turn connected to ground. A compensating capacitor is connected between the other end of the secondary winding and the loading resistor for compensating current flowing through the characteristic parallel capacitance of the transducer. A countercoupling line is connected between the loading resistor and one input of the signal generator so that the countercoupling current may be applied to the signal so as to reduce the resonance peak in the piezoelectric transducer.

7 Claims, 7 Drawing Figures

METHOD AND CIRCUIT FOR DRIVING A PIEZOELECTRIC TRANSDUCER

FIELD AND BACKGROUND OF THE INVENTION

The present invention relates in general to video recording equipment and in particular to a new and useful method and apparatus for reducing a resonance peak in a piezoelectric transducer used in particular for recording video signals on a video disk.

DESCRIPTION OF THE PRIOR ART

A prior art disclosure (German Pat. No. 1,574,489) was made on the recording of a wide-band signal of several MHz, specifically a video signal on a video disk. This patent involved mechanically recording a signal in the shape of a frequency modulated carrier along a spiral track of a disk and tracing it according to the principle of so-called pressure sensing. With such a mechanical recording, the cutting stylus itself is supposed to carry out mechanical oscillations on the order of magnitude of several MHz. Because of the inertia of the cutting stylus, however, this is possible only with some difficulty.

Other known methods involve the input of a video signal into a buffer memory. Specifically, the signal is recorded on film with tracing at reduced speed, and the signal is then mechanically recorded on a disk at this speed, e.g. reduced by a factor of 25. Such a buffer memory, however, represents an additional expenditure. Furthermore it multiplies the time required for cutting. Efforts have been made, therefore, to maximally raise the upper frequency limit, at which a cutting stylus can still cut.

With a prior art recording unit (German Pat. No. 2,203,095) the electromechanical transducer comprises a longitudinal oscillator made of an amorphous piezooxide having a high coupling coefficient of about and exceeding 0.6, which is manufactured from a mixture of metal oxides, specifically lead-, zirconium- and titanium oxides. The transducer's dimensions are so selected that its natural frequency somewhat exceeds the maximal frequency to be recorded, whereby the ohmic electric resistance of the electric circuit is so dimensioned that the resonance step-up of the transducer natural frequency is kept sufficiently low. Any further raising of the natural frequency and that way of the upper frequency limit is set a limit by a continual reduction in transducer mechanical dimensions and then because the supplied electrical energy can no longer be converted without difficulty into the required cutter deflection.

Another feasible way of extending the frequency upwardly consists in locating the natural frequency of the transducer within the operating frequency range in and providing for additional means by which to reduce the damaging effect of this natural frequency. This can be accomplished specifically by mechanical or electrical attenuating means.

An equivalent electric circuit diagram and the characteristics of the described transducer will now be explained.

FIG. 1 shows an equivalent circuit diagram of transducer 3, $L_1$ designates the oscillatory mass of transducer, $C_1$ the flexibility of the transducer, $R_1$ the payload, produced by the radiated energy and losses in the transducer, and $C_0$ the parallel capacitance of the mechanically fixed-positioned transducer. Because $C_1$ represents the flexibility of the transducer, the voltage $U_{C1}$ across capacitance $C_1$ is a key factor for the mechanical deflection of the transducer and that way of the cutter, i.e., the cutting amplitude; namely, the mechanical deflection of transducer 3 is proportional to said voltage. The prime prerequisite, then, for a uniform frequency response of cutting amplitude is that voltage $U_{C1}$ rated at constant input voltages $U_0$ at input terminals 1,2 of transducer 3 is maximally independent from the frequency of voltage $U_0$.

FIG. 2 shows the time slope of a conductance value Y of the transducer 3 effective between terminals 1,2 as a function of the frequency of the applied voltage $U_0$. The time slope of the total current flowing through the transducer at constant supply voltage amplitude is also thus indicated. Transducer 3 has a series-resonance peak at frequency $f_1$, which is substantially determined by the values of $L_1$ and $C_1$, as well as a parallel-resonance peak at frequency $f_2$, which is substantially determined by $C_0$. Evidently, with such a conductance time slope in the frequency response of the deflection of the transducer 3, strong resonance step-ups or step-downs occur. Such a prior art transducer has been described in more detail in the book *Piezooxide Transducers* by Valvo, 1968, pp. 51-52.

Because $U_{C1}$ determines the mechanical deflection of transducer 3, the frequency response of its mechanical deflection is proportional to the voltage across capacitor $C_1$. This voltage, however, as well as the voltages across $L_1$ and $R_1$, and also the currents, are not externally accessible by the series circuit and capacitance $C_0$, because transducer 3 is accessible only at its input terminals 1,2 and only there can it be supplied or wired.

FIG. 3 shows the voltage $U_{C1}$ across capacitance $C_1$ and thus the mechanical deflection of transducer 3 in a standard view. Characteristic curve maxima in FIGS. 2 and 3 coincide better, for lower internal transducer attenuations shown by resistor $R_1$. The frequency response in the mechanical deflection then shows a strong step-up at frequency $f_1$.

SUMMARY OF THE INVENTION

The present invention provides an apparatus and method for reducing the resonance peak or step-up of a piezoelectric transducer, thereby increasing the effectiveness of such a device in recording video signals.

Accordingly, an object of the present invention is to provide a method for reducing a resonant peak in a piezoelectric transducer for mechanically recording a signal having a band width of several MHz, and in particular recording on a video disk comprising, supplying a video signal to the piezoelectric transducer, applying a countercoupling current in parallel across terminals of the piezoelectric transducer for compensating current through a characteristic parallel capacitance of the transducer.

Another object of the present invention is to provide a circuit for reducing the resonant peak in a piezoelectric transducer comprising a signal generator for generating a video signal, a transformer having a primary winding connected across terminals of the signal generator, a secondary winding of the transformer having a symmetrically centrally disposed ground connection, a piezoelectric transducer having first and second terminals, the first terminal connected to one end of the secondary winding, the transducer having a characteristic parallel impedance capacitance and resistance and parallel characteristic capacitance in parallel to the series characteristic, a compensating capacitor connected to an opposite end of the secondary winding, this compensating capacitance and the second terminal of the transducer connected to a loading resistor in turn connected to a ground connection, and a line connected between the resistor and one terminal of the signal generator, whereby current in the parallel characteristic capacitance is compensated by the current in the compensating capacitor, thereby reducing the resonant peak in the piezoelectric transducer.

The object of the invention is to reduce the resonance step-up shown in the frequency response of the mechanical deflection in the transducer.

The solution according to the invention consists of two steps. Initially the current is compensated by parallel capacitance $C_0$. In that way only does the second step become feasible, whereby the interfering step-up in voltage $U_{C1}$ can be directly picked up and balanced by countercoupling. If the voltage across resistor $R_1$ could become accessible, then this voltage could be used directly for countercoupling purposes if this voltage is subtracted from the supply voltage $U_0$ for the transducer. Such a theoretically conceivable circuit is shown in FIG. 4. But because the voltage across resistor $R_1$ is inaccessible, this voltage is artificially produced, namely by the compensation of the current flowing through $C_0$ according to the first step. The voltage across a resistor, which is directly series-switched with transducer 3, e.g., applied between terminal 2 and ground, would also not be directly suitable for this purpose. A current would flow through this resistor, namely, a current through series circuit $L_1$, $C_1$, $R_1$, and a current through $C_0$ which has a phase relation differing from that through $R_1$. With the solution according to the invention, however, the current is directly gated by $R_1$.

The various features of novelty which characterize the invention are pointed out with particularity in the claims annexed to and forming a part of this disclosure. For a better understanding of the invention, its operating advantages and specific objects attained by its uses, reference is made to the accompanying drawings and the descriptive matter in which a preferred embodiment of the invention is illustrated.

DESCRIPTION OF THE PREFERRED EMBODIMENT

Figure 1:
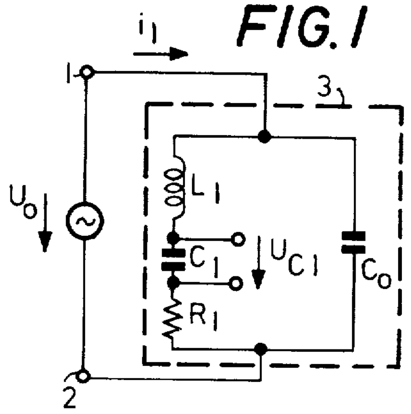
FIG. 1 is a schematic diagram of an equivalent circuit for a piezoelectric transducer as used here and in the prior art.

Referring now to the drawings in particular, the invention embodied therein is shown with reference to a preferred embodiment of the invention.

Figure 5:
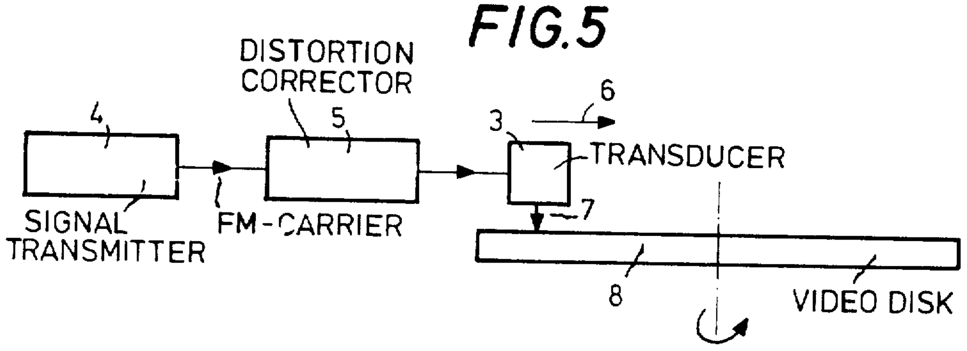
FIG. 5 is a block diagram showing, in principle, the mechanical recording of a video signal according to the invention.

In FIG. 5 a video signal-frequency modulated carrier originates with signal transmitter 4. The carrier is fed to transducer 3, not directly but via a distortion corrector 5, which differing the circuit according to the invention for getting a frequency response in the mechanical deflection without any resonance step-up. Transducer 3 controls cutting stylus 7, which mechanically records the signal on a moving medium such as a rotating video disk 8 by moving in the radial direction 6 along a spiral track.

Figure 4:
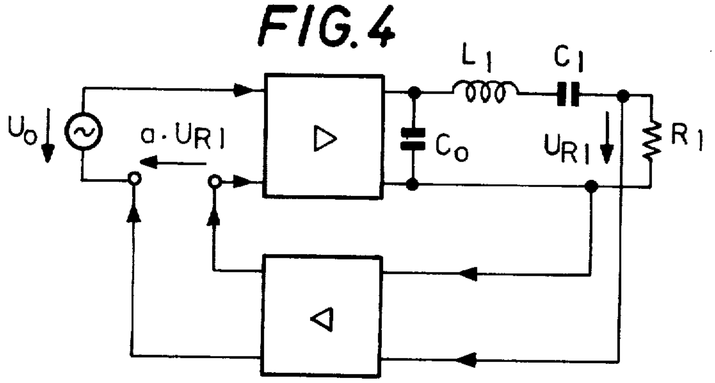
FIG. 4 is a block diagram of a theoretical circuit used to compensate and reduce the peak resonance of the transducer.
Figure 6:
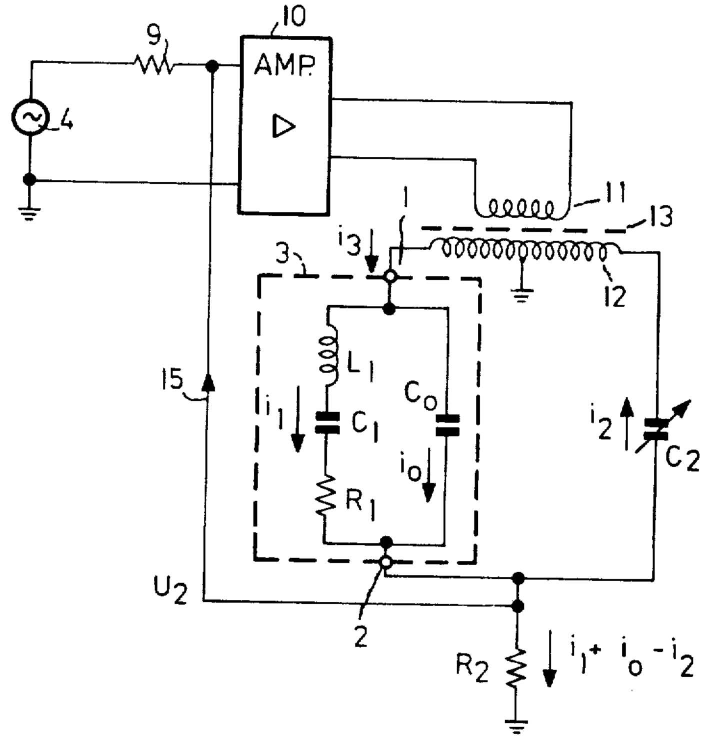
FIG. 6 is a circuit according to the invention.

In FIG. 6 the signal is fed from signal transmitter 4 via resistor 9 and amplifier 10 to the primary winding 11 of transformer 13. The secondary winding 12 of transformer 13 has a grounded center tap. Transformer 13 supplies transducer 3 with current $i_3$. Signal transmitter 4 with its amplifier and the transformer 13 thus form signal generator means connected to the terminals of the transducer 3. Terminal 2 of transducer 3 is grounded not directly but via resistor $R_2$. By way of resistor $R_2$ current $i_1$ flows through series circuit $L_1$, $C_1$, $R_1$. In this way the voltages across $R_1$ and $R_2$ are directly proportional to each other. The connection of resistor $R_2$ to the circuit and its cooperation with the secondary winding 12 of transformer 13 provide means for compensating the current of the characteristic parallel capacitance $C_0$. A state is then reached as theoretically indicated in FIG. 4, which initially has been designated as impossible.

Figure 3:
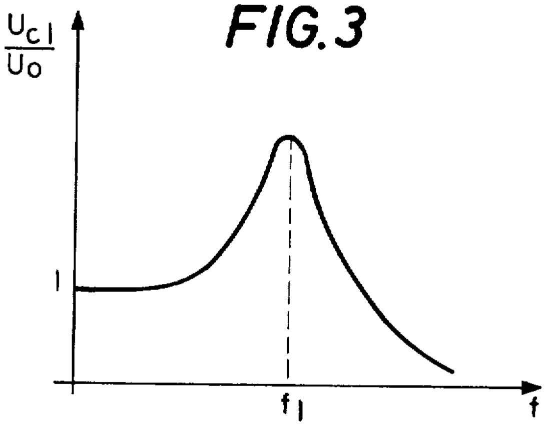
FIG. 3 is a characteristic graph showing the ratio of voltage across a series characteristic capacitance in the transducer over the inputted voltage as plotted against frequency applied to the transducer.

After current $i_0$ at resistor $R_2$ in the circuit according to FIG. 6 has been compensated or switched off, the aforementioned second measure becomes feasible, namely applying a countercoupling for eliminating the resonance step-up at $f_1$ in FIG. 3. For this purpose voltage $U_2$ across resistor $R_2$ is fed back to the input of amplifier 10 via line 15. Using this countercoupling means eliminates the resonance step-up according to FIG. 3. The rate of countercoupling can be selected by dimensioning resistors $R_2$ and 9 so that the resonance peak at frequency $f_1$ according to FIG. 3 is attenuated. Thereby resistor 9 also contains the internal resistance of signal transmitter 4.

Figure 2:
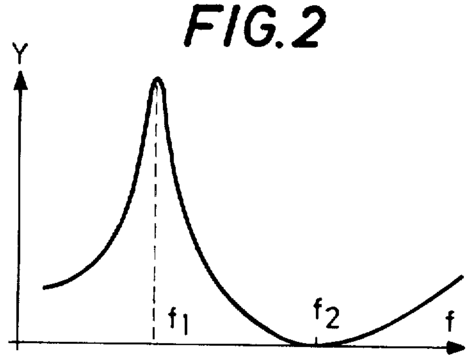
FIG. 2 is a characteristic graph showing conductance as opposed to frequency in the transducer of FIG. 1.

The rise of conductance Y at frequency $f_1$ according to FIG. 2 is not eliminated by way of countercoupling via line 15 alone, because, of course, the conductances of $L_1$, $C_1$, $R_1$ and $C_0$ cannot be affected. A reduction is produced by the described countercoupling, however, in the strong current rise produced by Y through transducer 3 at $f_1$.

Instead of a countercoupling, a resistor switched in series with transducer 3 can also be utilized. But in this case initially current $i_0$ is compensated—via capacitance $C_0$—by a further component of attenuating resistance.

Figure 7:
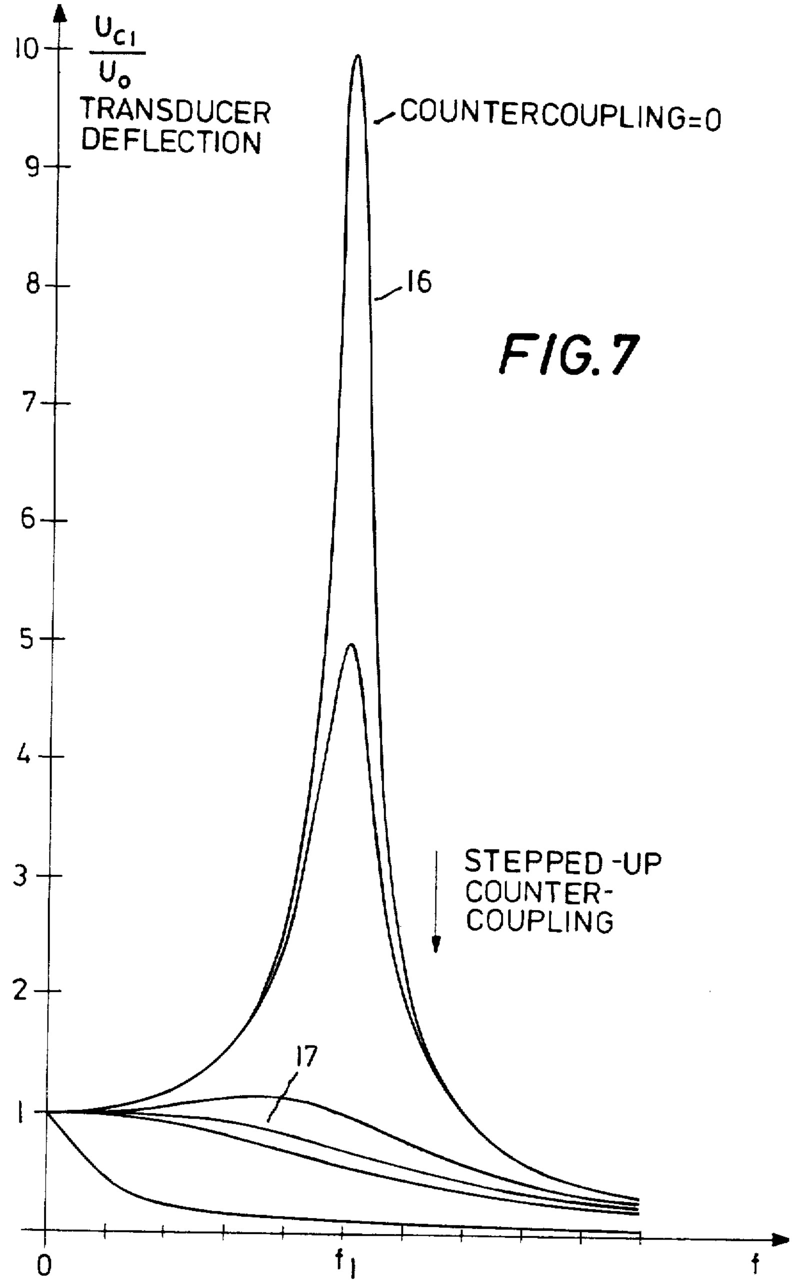
FIG. 7 is a graph showing the characteristic lines obtained by the application of the invention.

FIG. 7 shows the characteristic curve of transducer 3 for various magnitudes of countercoupling via line 15 according to FIG. 6. Curve 16 represents a characteristic for the case where no countercoupling is present. Evidently it is at frequency $f_1$, where an undesirable high resonance step-up is present. The other curves show that with rising countercoupling the interference resonance step-up decreases and is even overcompensated. Curve 17 shows an extensively equalized characteristic time slope, that is of the amount of mechanical deflection of transducer 3 as a function of frequency at constant amplitude of the controlled video signal. It is evident that a frequency response can be reached, which meets practical requirements by a suitably selected countercoupling via line 15 in FIG. 6.

While a specific embodiment of the invention has been shown and described in detail to illustrate the application of the principles of the invention, it will be understood that the invention may be embodied otherwise without departing from such principles.

What is claimed is:

1. An apparatus for reducing a resonance peak in a piezoelectric transducer for mechanically recording a signal having a band width of several MHz, in particular on a video disk, comprising, a signal generator having output terminals, a transformer having a primary winding connected to the output terminals of said signal generator, said signal generator generating a video signal having a band width of several MHz, said transformer having a secondary winding with a central tap connected to ground, a piezoelectric transducer connected to one end of secondary winding having a characteristic series capacitance, inductance and resistance and a characteristic parallel capacitance, said transducer having a first terminal connected to the secondary winding of said transformer and a second terminal, a capacitor connected between said second terminal of said transducer and an opposite end of said secondary winding, a resistor connected to the junction between said transducer and said capacitor, a line connected between one of the terminals of said signal generator and said junction, whereby a current in said parallel capacitance of said transducer is counteracted by a current in said capacitor for reducing the resonance peak of said piezoelectric transducer.

2. An apparatus for reducing a resonant peak in a piezoelectric transducer for mechanically recording a signal having a band width of several MHz, in particular for a a video disk, comprising, signal generator means for producing a signal, a piezoelectric transducer with characteristic series capacitance, inductants and resistance and characteristic parallel capacitance having first and second terminals connected to said signal generator means for receiving the signal, said series capacitance corresponding to a flexibility of said transducer and having a series capacitance voltage thereacross produced by the signal, the series capacitance voltage having a resonant peak at at least one frequency of the signal, said characteristic parallel capacitance of said transducer having a current thereacross produced by the signal, current compensating means connected between said signal generator means and said second terminal to compensate for the current in said characteristic parallel capacitance, and counter-coupling means connected between said said signal generator means and said second terminal for substantially reducing the resonant peak in said series capacitance voltage.

3. An apparatus according to claim 2, wherein said signal generator means comprises a signal transmitter, an amplifier connected to said signal transmitter, a transformer having a primary winding connected to said amplifier and a secondary winding connected across said first and second terminals of said transducer, said current compensating means comprising a tap of said secondary winding connected to ground and a resistor connected between said second terminal and ground.

4. An apparatus according to claim 3, further including a capacitor connected between said secondary winding and said second terminal.

5. An apparatus according to claim 4, wherein said capacitor is variable.

6. An apparatus according to claim 3, wherein said tap is a central tap of said secondary winding, and said counter-coupling means comprises a connection between said second terminal of said transducer and a connection between said signal transmitter and said amplifier.

7. A method of reducing a resistance peak in a piezoelectric transducer for mechanically recording a signal having a bandwidth of several MHz, in particular in recording on a video disc comprising, providing a piezo-electric transducer having a first and second terminal, applying a signal to said first and second terminals, the piezo-electric transducer having a characteristic series capacitance, inductance and resistance, the series capacitance corresonding to a flexibility of the transducer and having a series capacitance voltage thereacross produced by the signal, the piezoelectric transducer also having a characteristic parallel capacitance with a current thereacross produced by the signal, compensating for the current in said characteristic parallel capacitance, and applying a counter-coupling voltage to the signal before the signal is applied to the transducer to reduce a resonant peak in said series capacitance voltage.

* * * * *